United States Patent [19]

Katayama et al.

[11] Patent Number: 5,083,282
[45] Date of Patent: Jan. 21, 1992

[54] TRANSITION STATE DETECTING DEVICE AND MEASURING DEVICE USING THE SAME

[75] Inventors: Aiichi Katayama, Isehara; Kenji Nakatsugawa, Kanagawa; Hitoshi Sekiya; Takafumi Nakamura, both of Atsugi, all of Japan

[73] Assignee: Anritsu Corporation, Tokyo, Japan

[21] Appl. No.: 445,846

[22] PCT Filed: Mar. 31, 1989

[86] PCT No.: PCT/JP89/00340
§ 371 Date: Nov. 27, 1989
§ 102(e) Date: Nov. 27, 1989

[87] PCT Pub. No.: WO89/09412
PCT Pub. Date: Oct. 5, 1989

[30] Foreign Application Priority Data

Mar. 31, 1988 [JP] Japan ................................ 63-76381
Mar. 31, 1988 [JP] Japan ................................ 63-76382

[51] Int. Cl.$^5$ ................................................ G06G 7/00
[52] U.S. Cl. .................................... 364/487; 324/103 P
[58] Field of Search ............................. 364/485–487; 307/351, 354; 324/102, 103 P

[56] References Cited

U.S. PATENT DOCUMENTS

| 4,110,748 | 8/1978 | Marino | 307/351 |
| 4,131,857 | 12/1978 | Clymer | 307/354 |
| 4,213,085 | 7/1980 | Ramer | 324/103 P |
| 4,495,642 | 1/1985 | Zellmer | 364/487 |
| 4,580,227 | 4/1986 | Lavergnat et al. | 364/487 |
| 4,697,098 | 9/1987 | Cloke | 307/354 |
| 4,769,597 | 9/1988 | Sano | 324/102 |
| 4,870,349 | 9/1989 | Kakiuchi et al. | 324/103 P |

FOREIGN PATENT DOCUMENTS

| 47-24862 | 10/1972 | Japan . |
| 49-24697 | 6/1974 | Japan . |
| 54-76777 | 5/1979 | Japan . |
| 61-221661 | 10/1986 | Japan . |
| 62-277561 | 12/1987 | Japan | 324/103 P |
| 1023246 | 6/1983 | U.S.S.R. | 324/103 P |

*Primary Examiner*—Salvatore Cangialosi
*Attorney, Agent, or Firm*—Frishauf, Holtz, Goodman & Woodward

[57] ABSTRACT

A transition state detecting device of the invention is a device which is applied to the output stage of a detecting circuit such as a spectrum analyzer so as to display the waveform of an input signal in the form of a parameter and evaluate its characteristics. In order to perform real-time, quantitative measurement, the device includes a differentiating means (1) for differentiating an input signal and outputting a differential signal representing a transition state of the input signal, and a detecting means (2) for detecting the peak value of the differential signal output from the differentiating means and outputting a parameter corresponding to the transition state of the input signal.

12 Claims, 16 Drawing Sheets

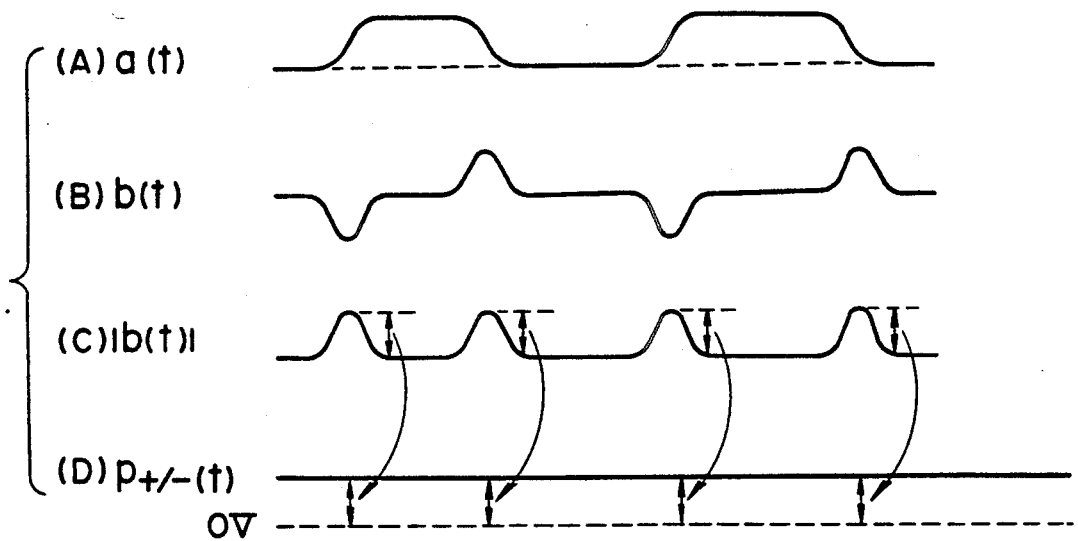
F I G. 9
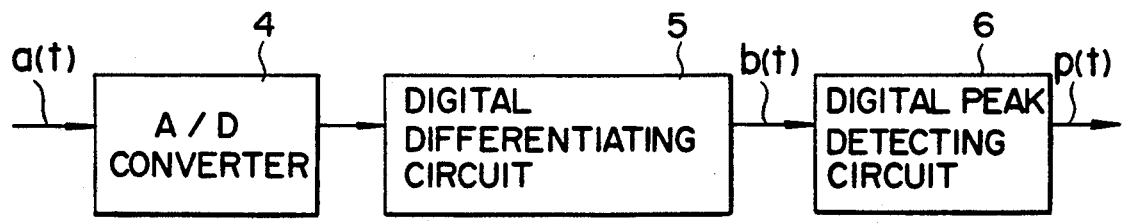
F I G. 10

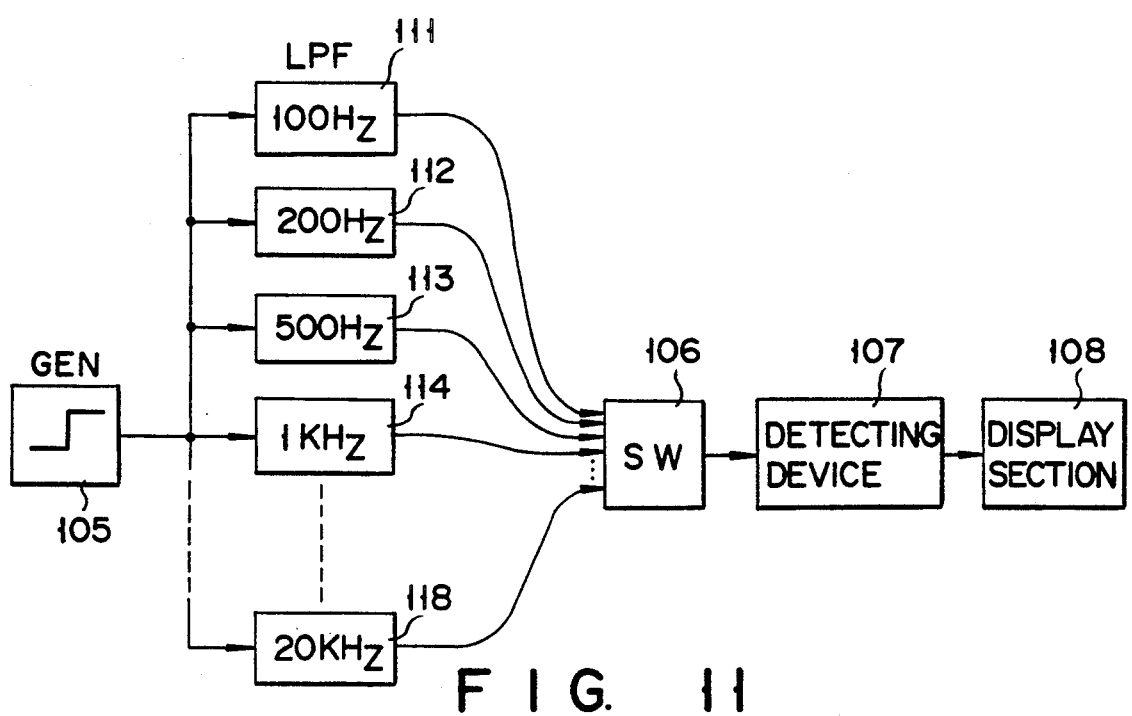
F I G. 11
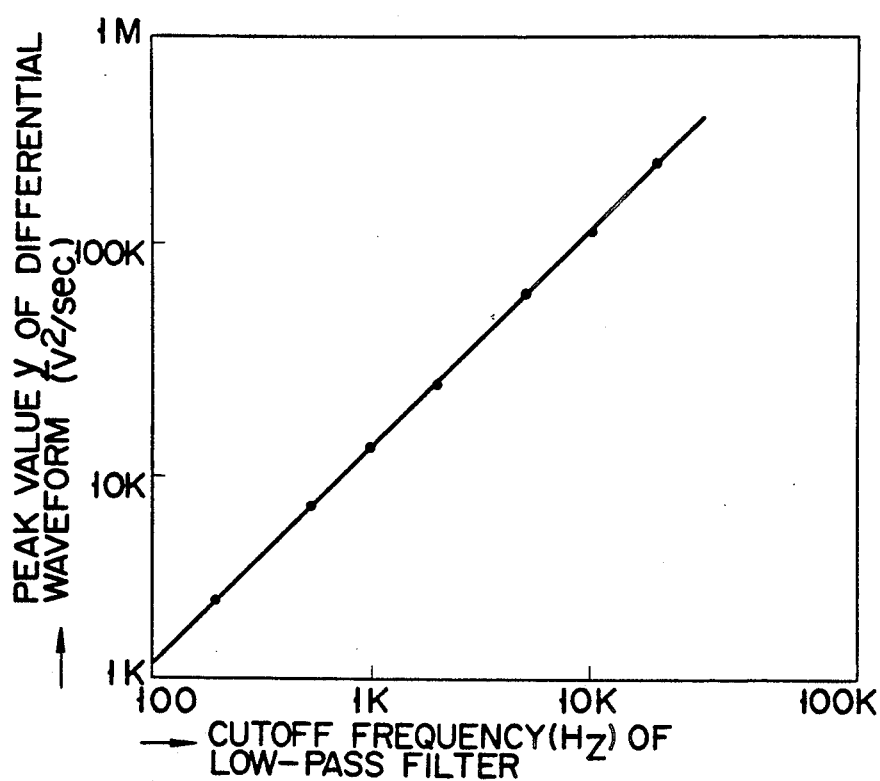
F I G. 12

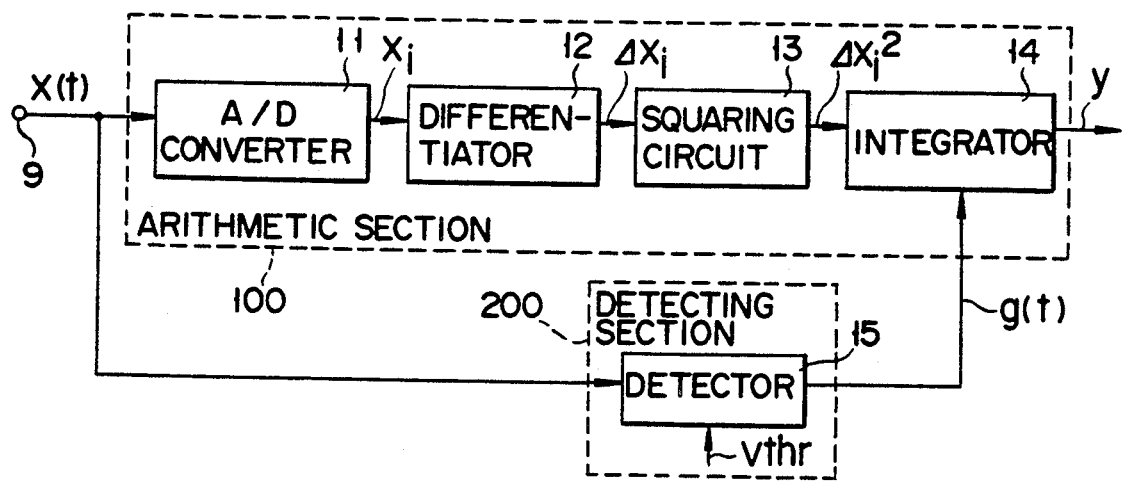
F I G. 13
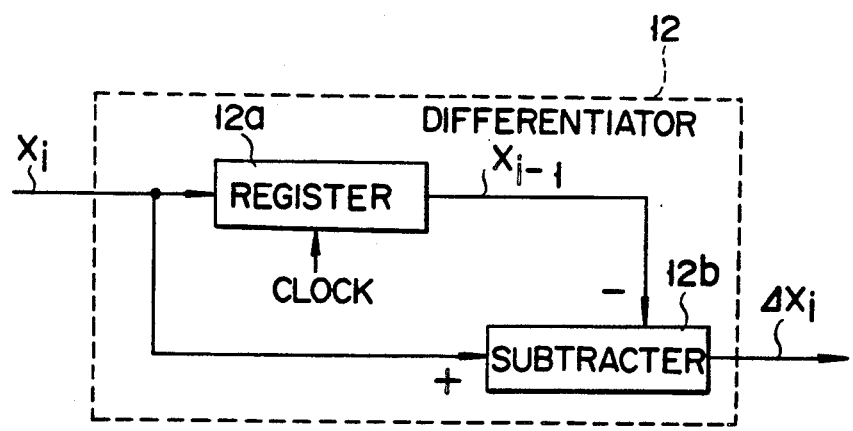
F I G. 14

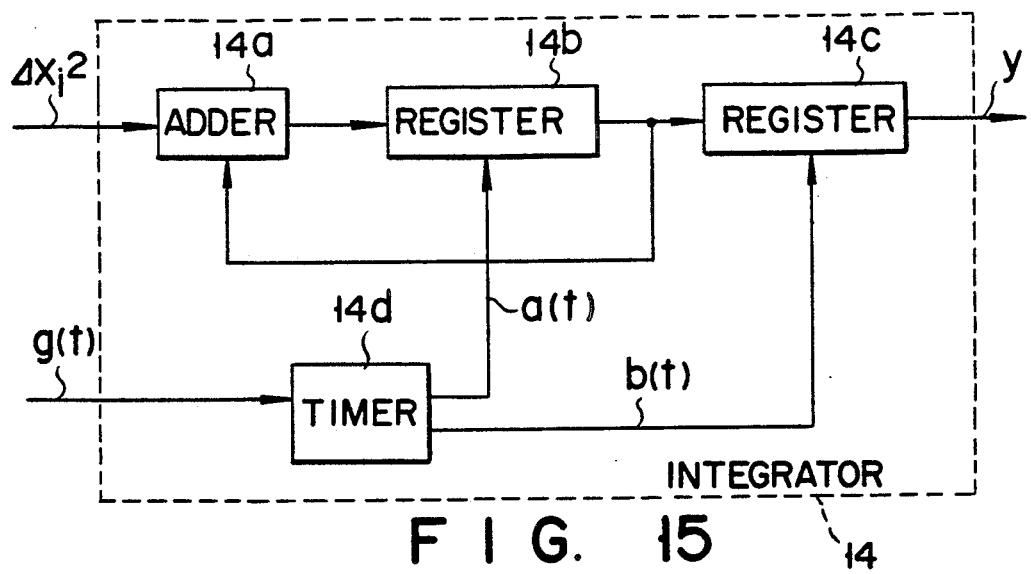
F I G. 15
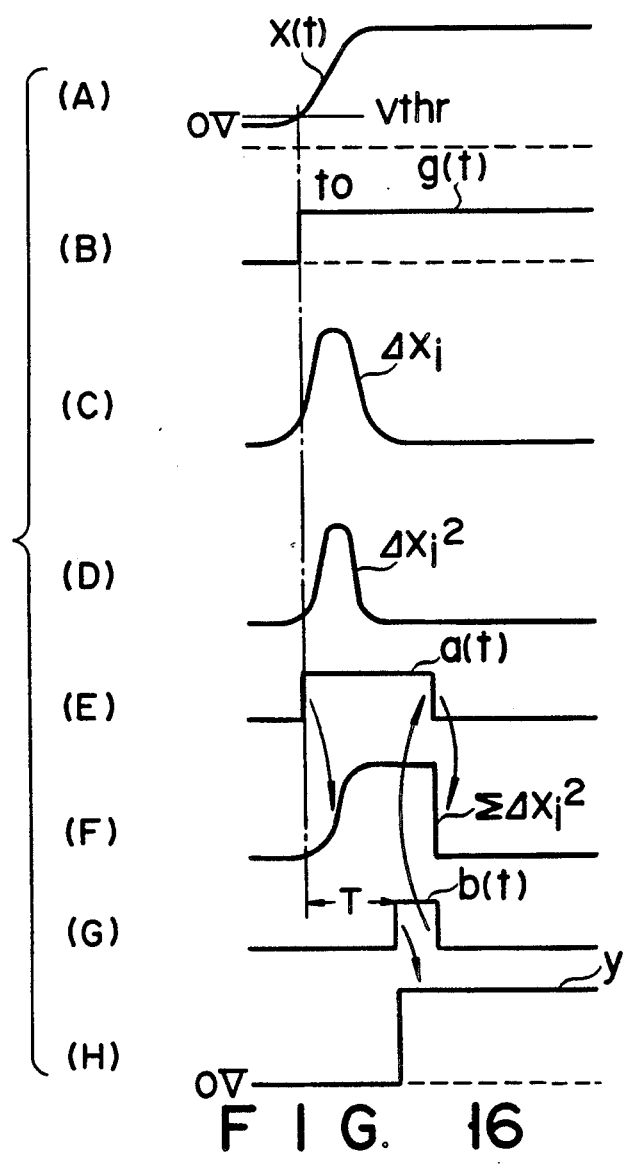
F I G. 16

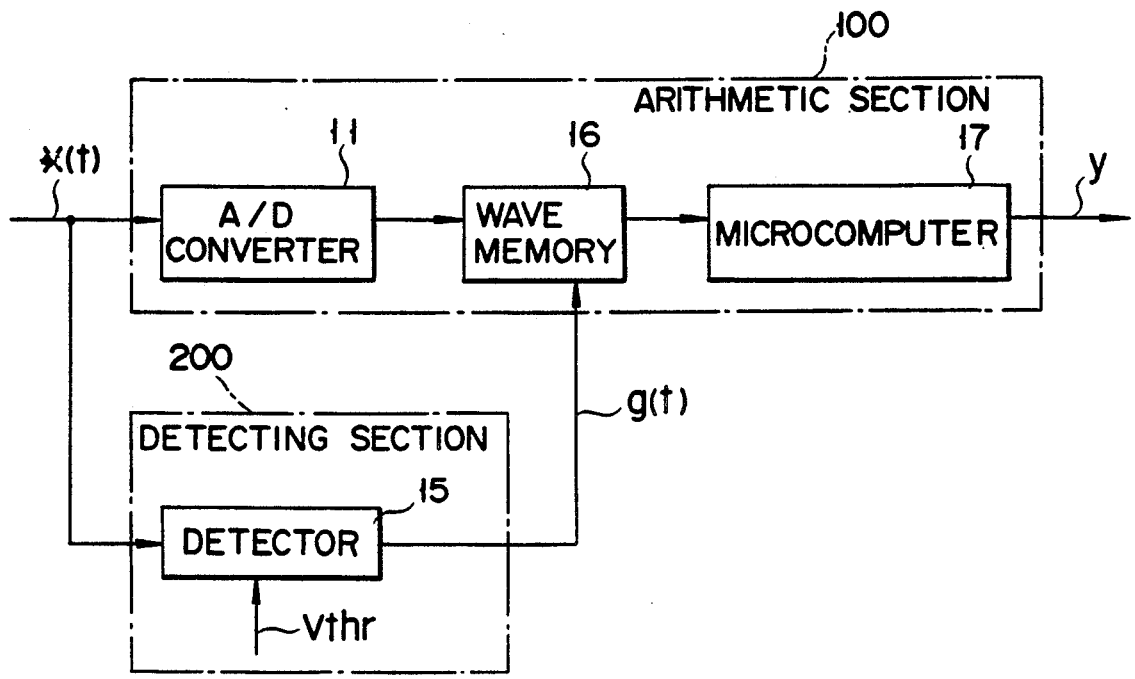
F I G. 17
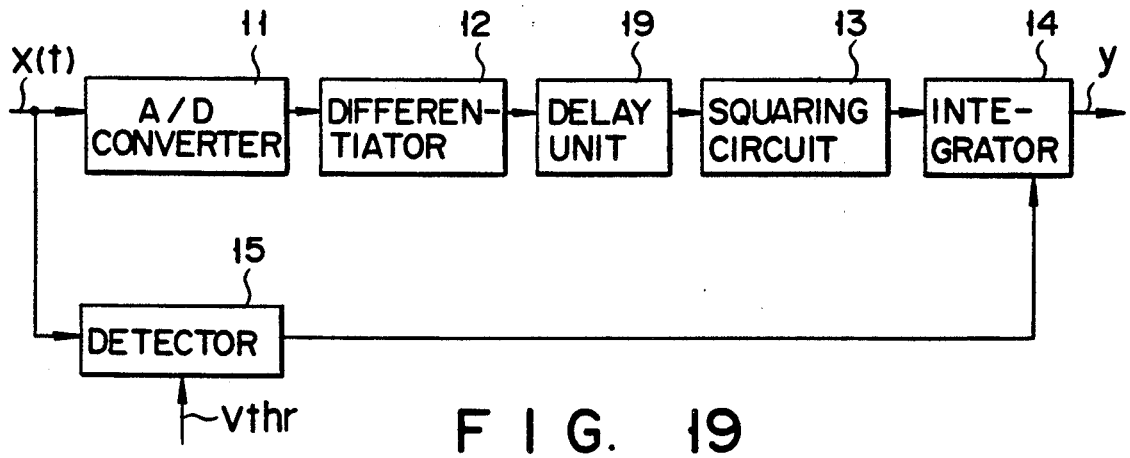
F I G. 19

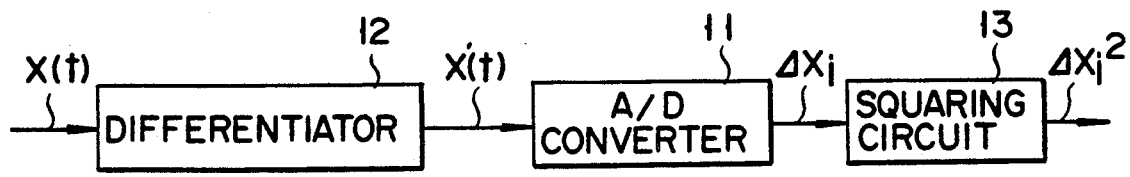
F I G. 18(A)
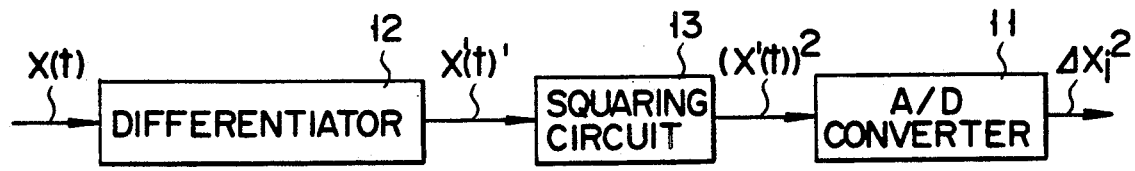
F I G. 18(B)
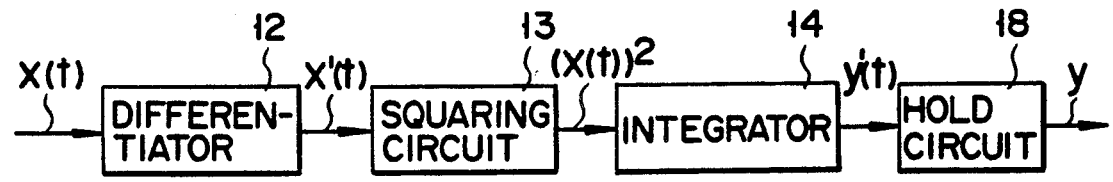
F I G. 18(C)

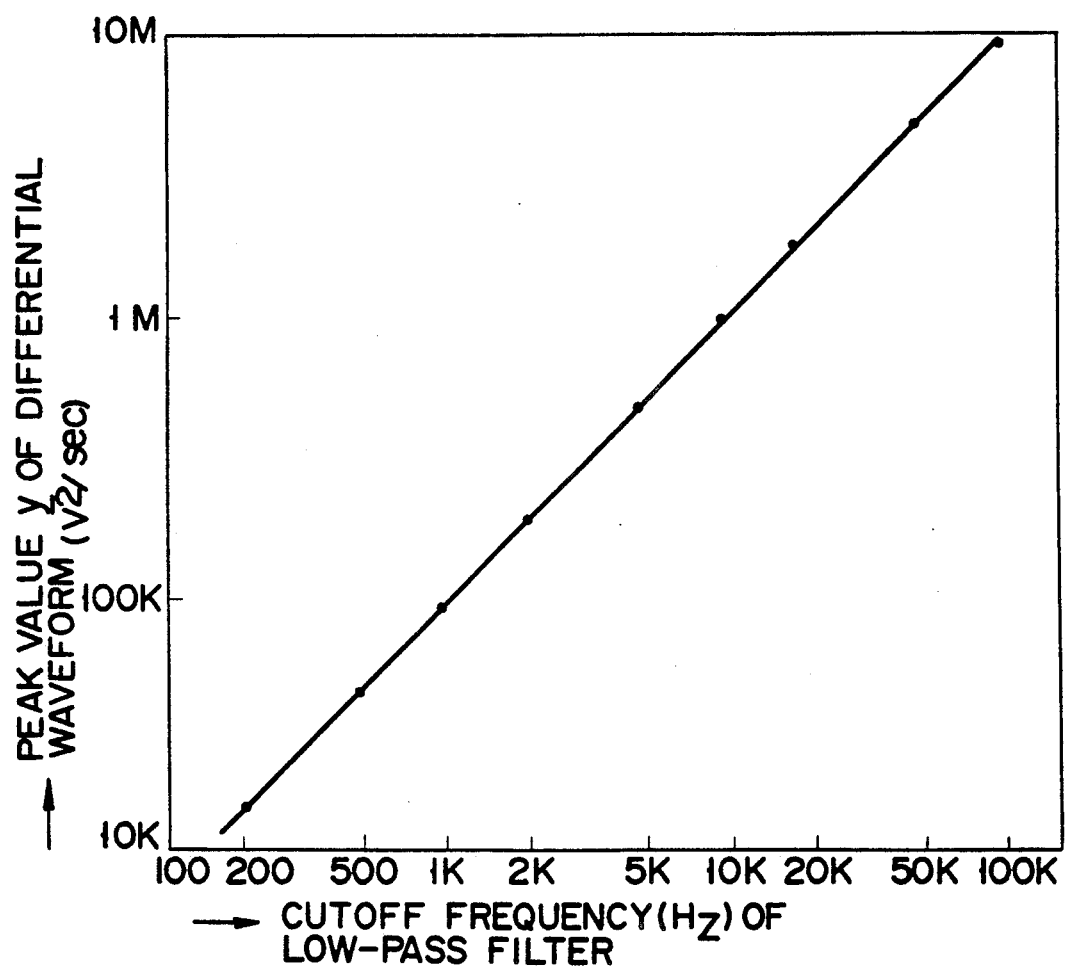
F I G. 20

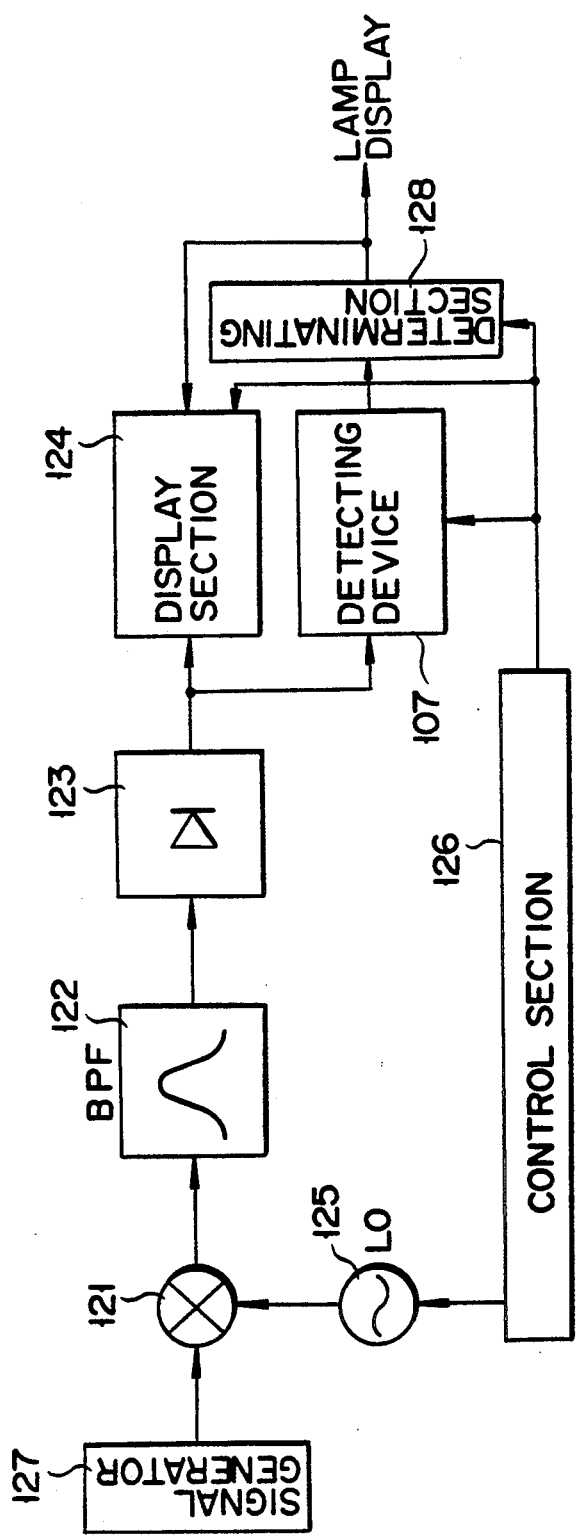
F I G. 23

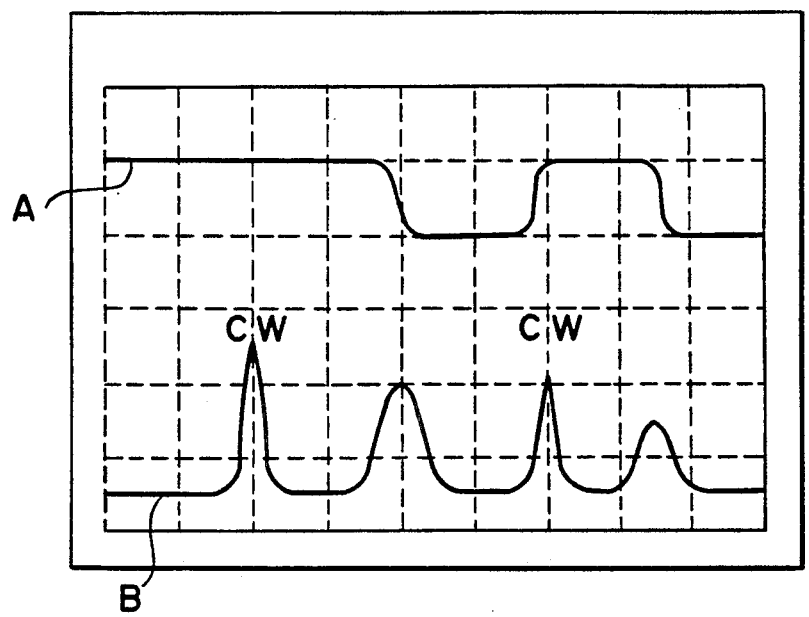
F I G. 26
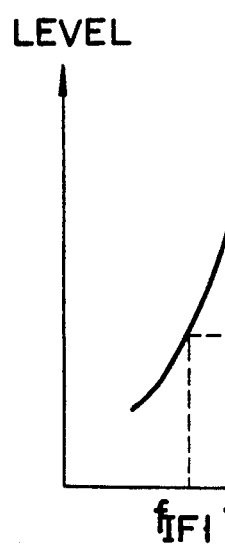
F I G. 27(A)
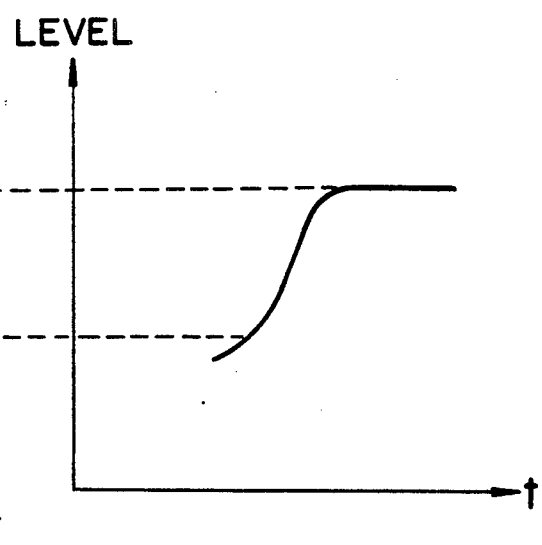
F I G. 27(B)

TRANSITION STATE DETECTING DEVICE AND MEASURING DEVICE USING THE SAME

TECHNICAL FIELD

The present invention relates to a device for detecting a transition state of an input signal and a measuring device using the same and, more particularly, to a device, applied to the output stage of a detecting circuit such as a spectrum analyzer, for displaying the leading edge waveform of an input signal in the form of a parameter and evaluating its characteristics.

BACKGROUND ART

Electronic measuring devices such as a spectrum analyzer and an oscilloscope allow an electrical phenomenon which cannot be directly seen with human eyes to be seen as a waveform varying as a function of time. Therefore, they are widely used for observation of electrical phenomena. That is, these measuring devices can measure and evaluate the voltage values, current values, period, frequency characteristics, rising characteristics, and the like of input signals.

A description will be made especially on a case wherein a signal to be evaluated is a digital signal having multi-value voltage levels, e.g., a PCM (pulse-code modulation) signal.

As a technique of evaluating the characteristics or quality of a PCM signal, the degree of opening of an eye pattern is measured. More specifically, an eye pattern is obtained by synchronously sweeping a PCM signal using an oscilloscope and displaying signal waveforms to superpose them. An average amplitude level (a) and a minimum amplitude level (b) of the eye pattern are obtained by manual observation, and their ratio is calculated as a degree of opening.

In another technique, digital waveform analysis is applied to eye pattern measurement. More specifically, a plurality of waveform data are stored, and the levels of all the waveform are measured. Thereafter, the degree of opening of an eye pattern is automatically obtained by arithmetically processing the measurement results.

Since these conventional techniques involve manual observation, satisfactory reliability cannot be ensured in terms of measurement precision and resolution. In addition, in automatic measurement using the conventional digital waveform analysis technique, in order to ensure compatibility of measurement values obtained by automatic measurement with those obtained by manual observation, complicated processing is required. Hence, real-time measurement is difficult to perform, and high-speed measurement cannot be easily realized.

In order to eliminate the above-described drawbacks, a demand has arisen for an accurate, simple measurement technique. A great deal of attention has been paid to a technique for evaluating the characteristics of an input signal by detecting the leading and trailing edges of the input signal, i.e., a waveform in a transition state. That is, the inclinations of an input signal, which rises and falls, are read as a waveform, and data processing is performed later. In this technique, however, the characteristics of an input signal cannot be quantitatively evaluated in a real-time manner.

DISCLOSURE OF INVENTION

It is an object of the present invention, therefore, to provide a transition state detecting device for performing real-time and quantitative detection of a transition state of an input signal.

It is another object of the present invention to provide a measuring device for performing real-time and quantitative detection of a transition state of an input signal.

According to an aspect of the present invention, there is provided a transition state detecting device comprising receiving means for receiving an input signal, differentiating means for differentiating the input signal received by the receiving means and outputting a differential signal representing a transition state of the input signal, and detecting means for detecting a peak value of the differential signal output from the differentiating means and outputting a parameter corresponding to the transition state of the input signal.

According to another aspect of the present invention, there is provided a measuring device comprising receiving means for receiving an output signal output from an object to be measured, converting means for frequency-modulating the output signal received by the receiving means and outputting a conversion signal, first detecting means for frequency-discriminating the conversion signal output from the converting means and outputting a first detection signal, differentiating means for differentiating the first detection signal output from the first detecting means and outputting a differential signal representing a transition state of the output signal, second detecting means for detecting a peak value of the differential signal output from the differentiating means and outputting a parameter corresponding to the transition state of the output signal, and display means for displaying the parameter output from the second detecting means.

Figure 1:
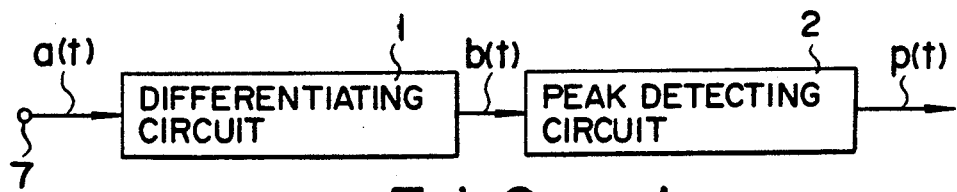
FIG. 1 is a circuit diagram showing an arrangement of a transition state detecting device according to the first embodiment of the present invention.
Figure 2:
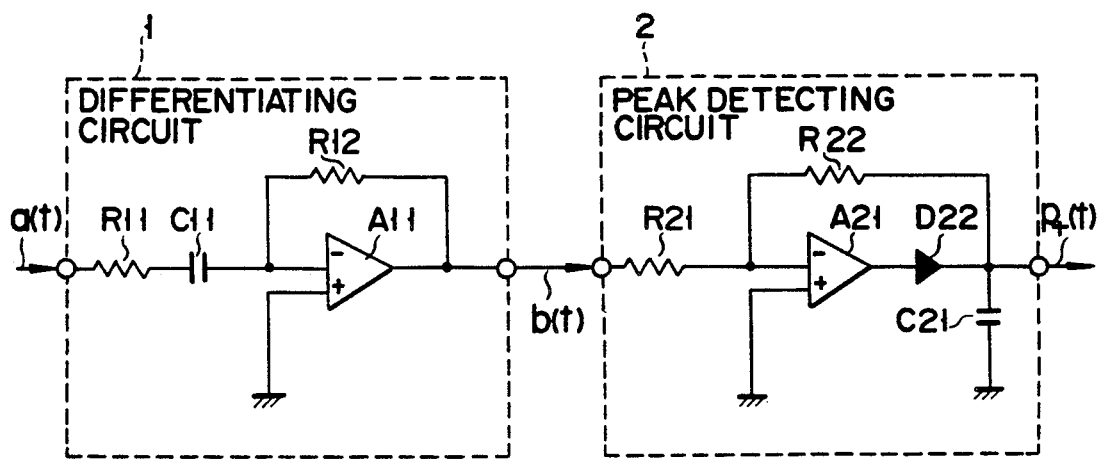
FIG. 2 is a circuit diagram showing a detailed arrangement of a circuit used in the embodiment in FIG. 1.
Figure 3:
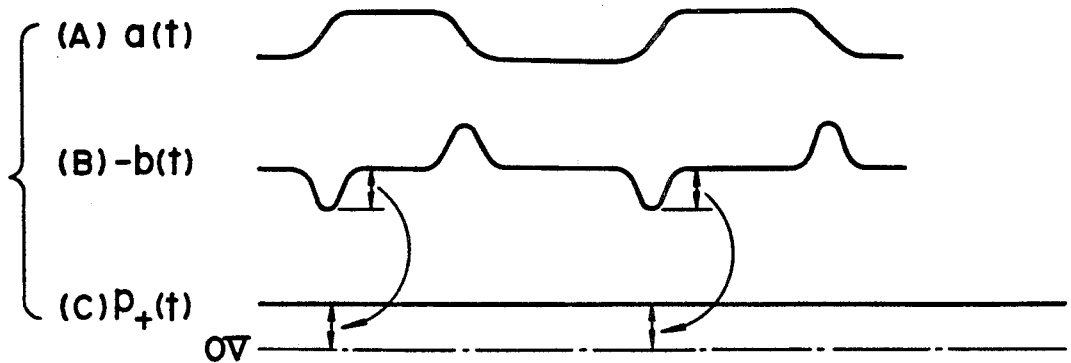
Figure 4:
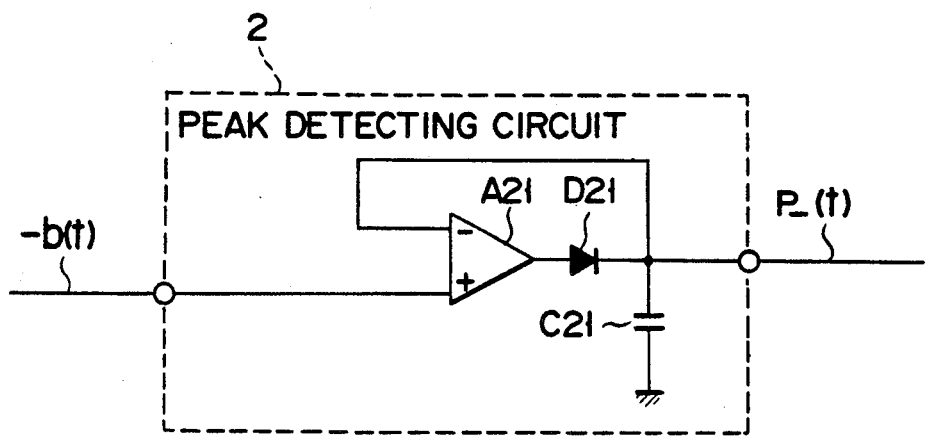
Figure 5:
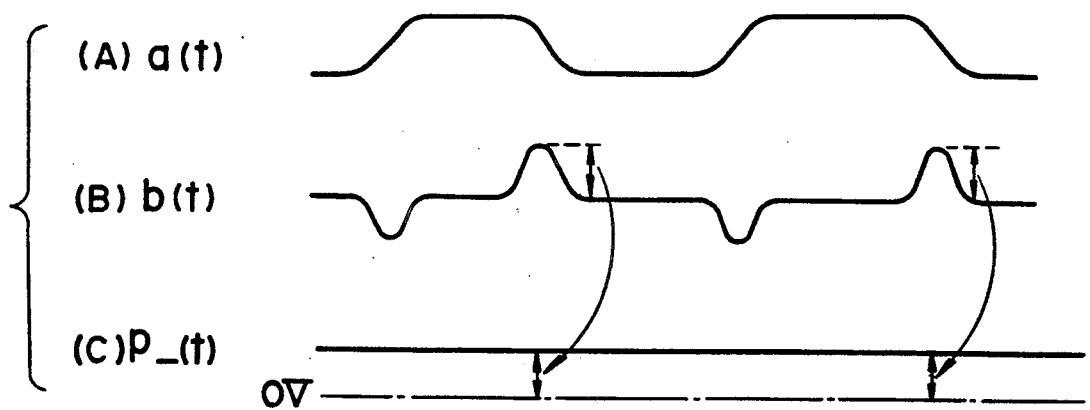
Figure 6:
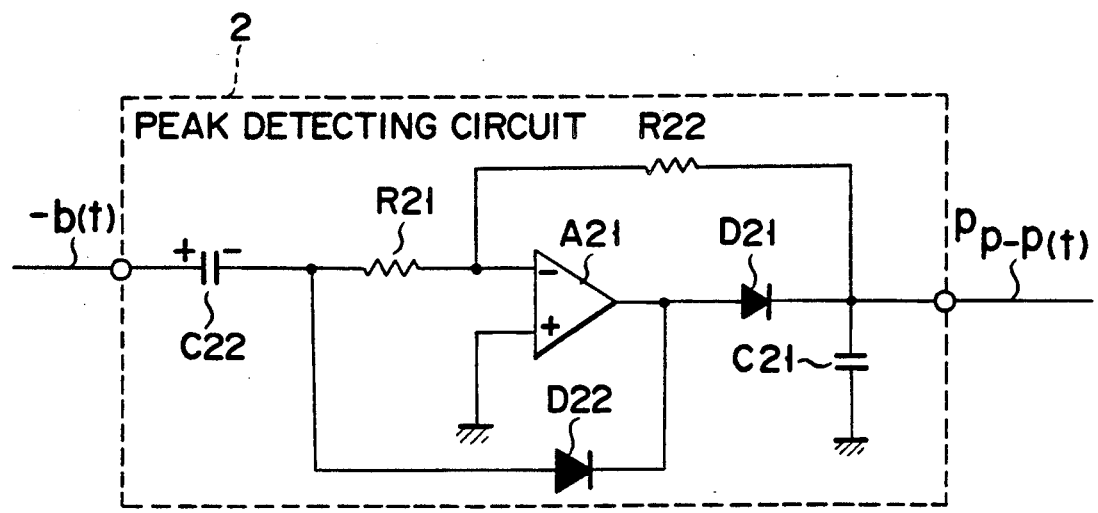
Figure 7:
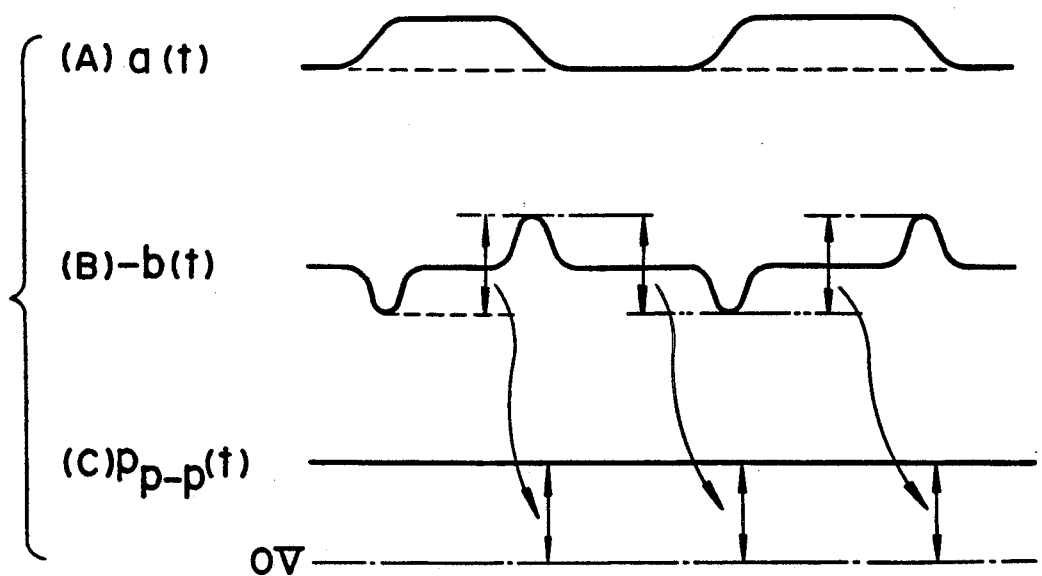
Figure 8:
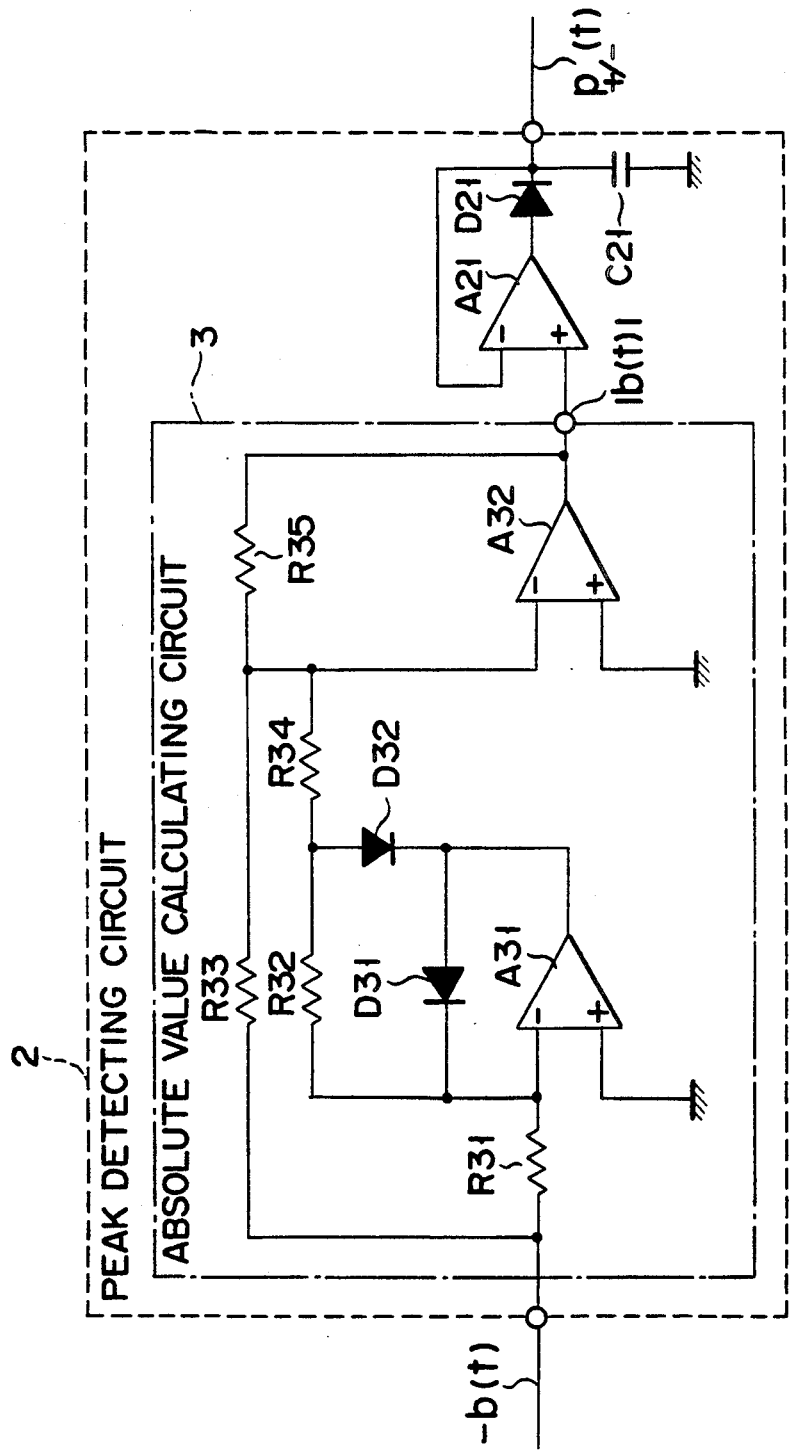
Figure 21:
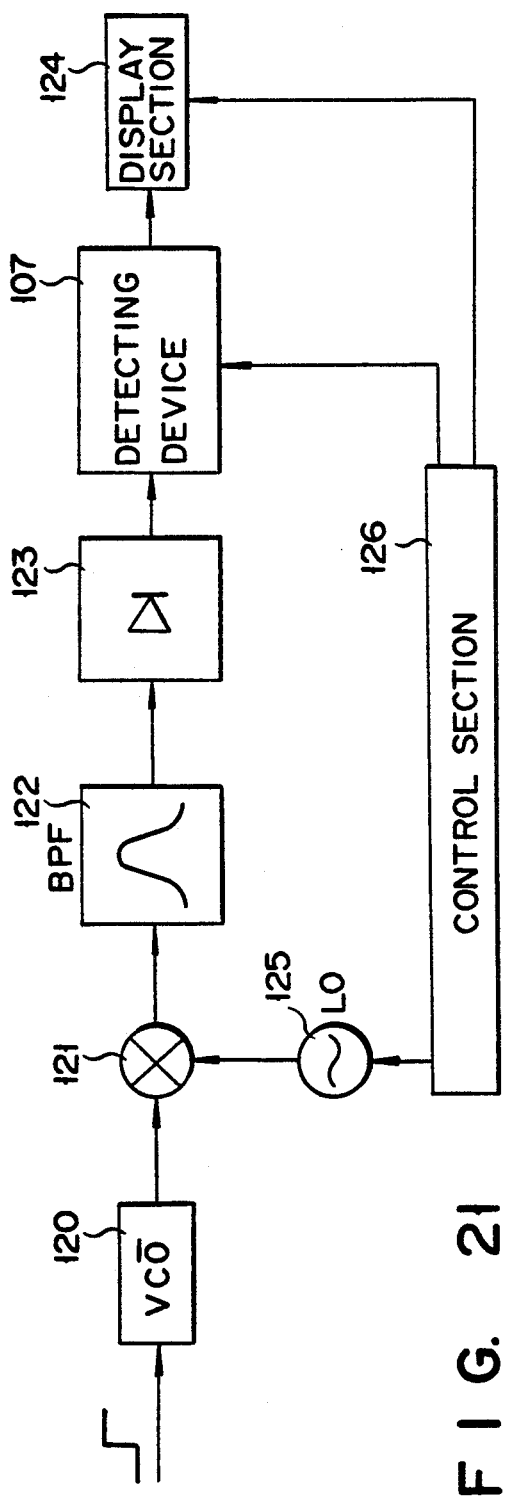
Figure 22:
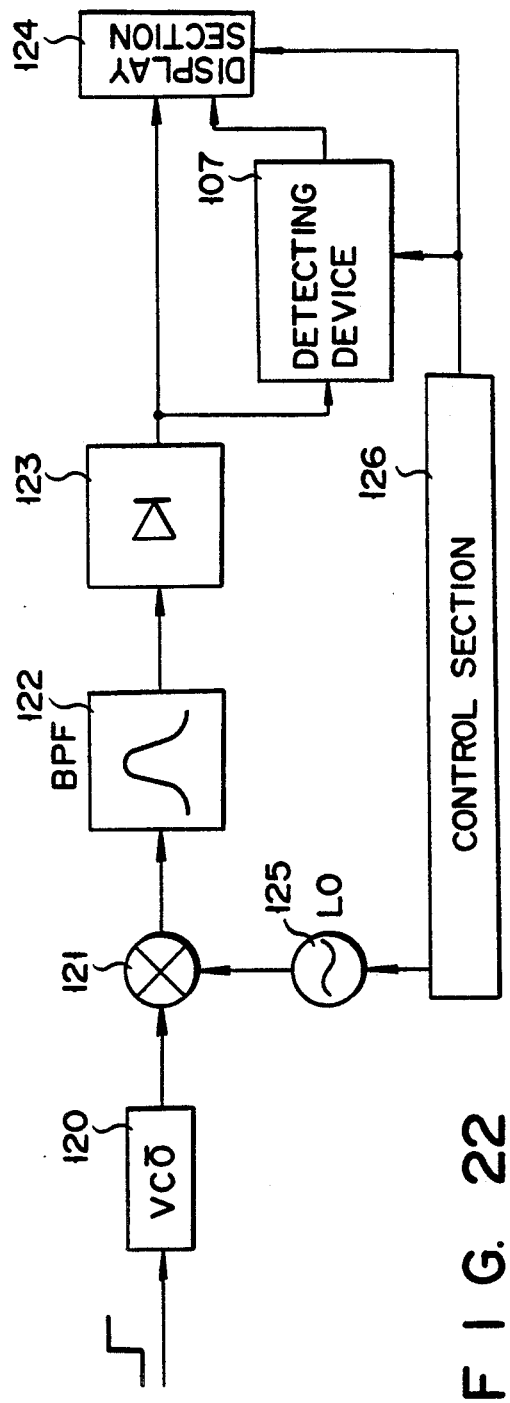
Figure 24:
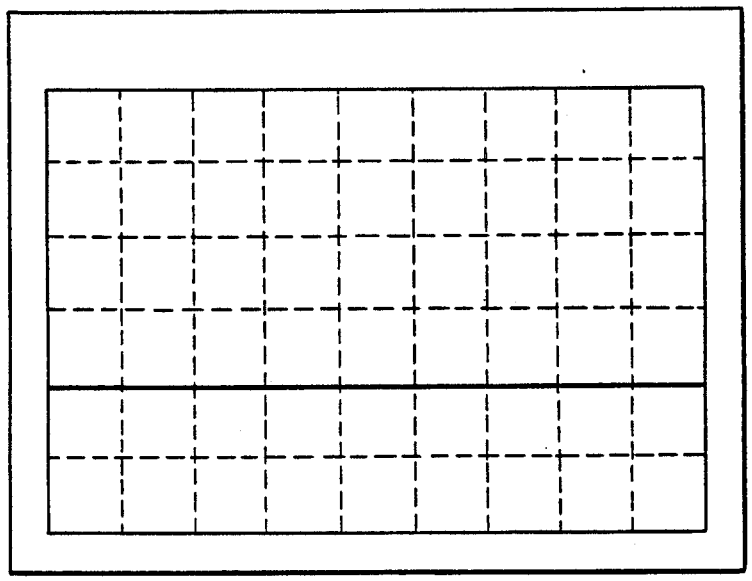
Figure 25:
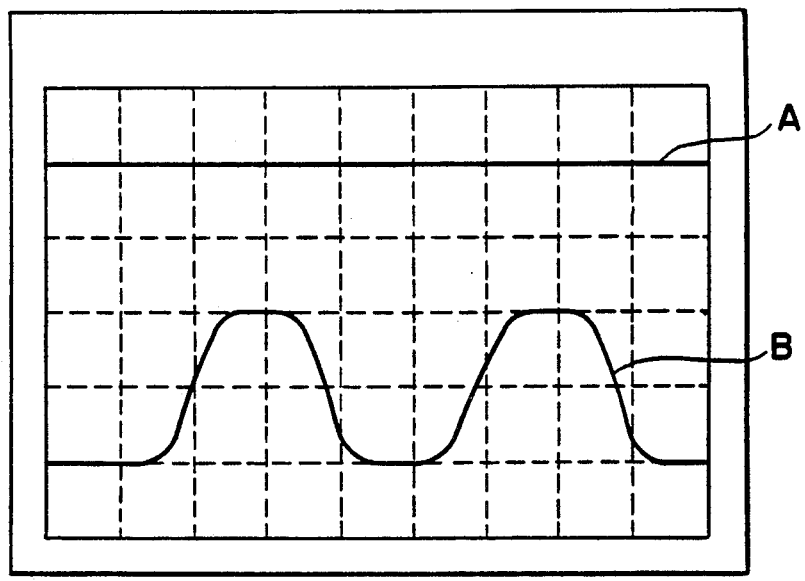
Figure 28:
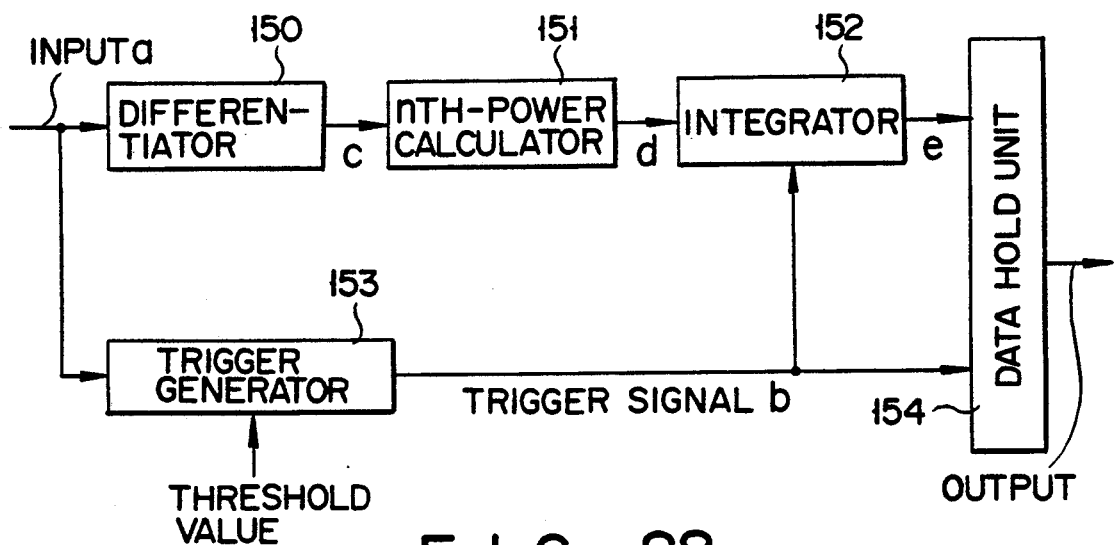
Figure 29:
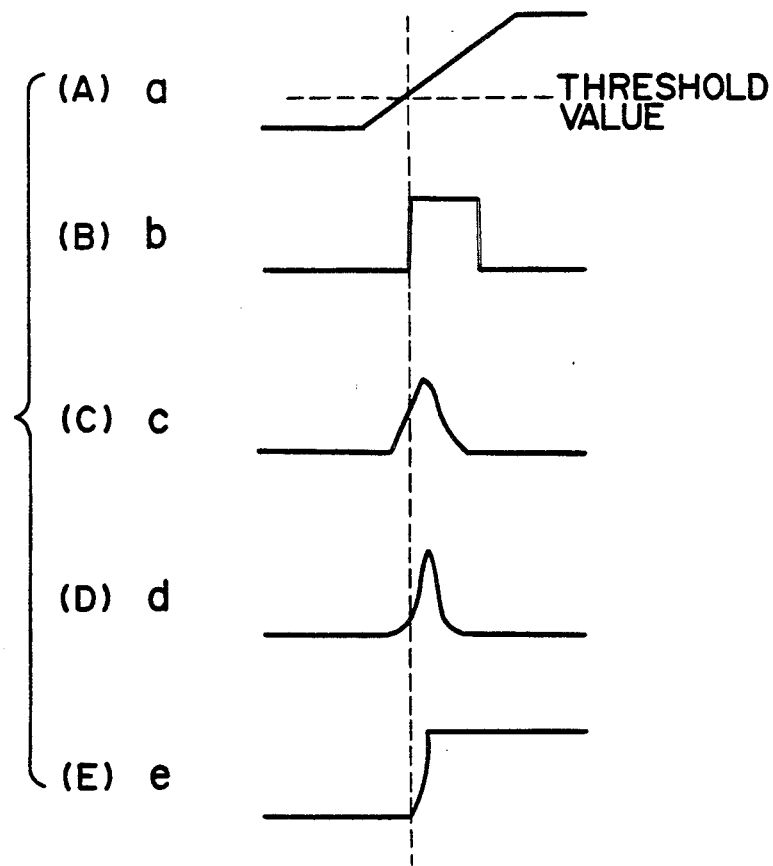

(A), (B), and (C) of FIG. 3 are timing charts showing signal waveforms appearing at the respective portions of the circuit in FIG. 2;

FIGS. 4, 6, and 8 are circuit diagrams showing other arrangements of a peak detecting circuit in FIG. 1;

(A), (B), and (C) of FIGS. 5 and 7, and (A), (B), (C), and (D) of FIG. 9 are respectively timing charts showing signal waveforms appearing at the respective portions of the circuits in FIG. 4, 6, and 8;

FIG. 10 is a view showing a digital circuit equivalent to the circuit in FIG. 1;

FIG. 11 is a circuit diagram showing an arrangement of a circuit for evaluating the characteristics of a low-pass filter by using the transition state detecting device of the present invention;

FIG. 12 is a graph showing a result obtained by evaluating the characteristics of each low-pass filter by using the transition state detecting device of the present invention;

FIG. 13 is a circuit diagram showing an arrangement of a transition state detecting device according to the second embodiment of the present invention;

FIG. 14 is a circuit diagram showing a detailed arrangement of a differentiator in FIG. 13;

FIG. 15 is a circuit diagram showing a detailed arrangement of an integrator in FIG. 13;

(A) to (H) of FIG. 16 are timing charts showing signal waveforms appearing at the respective portions of the device in FIG. 13;

FIGS. 17, 18(A), 18(B), 18(C), and 19 are views respectively showing other embodiments of the circuit in FIG. 13;

FIG. 20 is a graph showing a result obtained by evaluating other low-pass filters by using the device of the present invention;

FIG. 21 is a circuit diagram showing an arrangement in which the transition state detecting device of the present invention is applied to a spectrum analyzer;

FIG. 22 is a circuit diagram showing an arrangement in which the transition state detecting device of the present invention is applied to an oscilloscope;

FIG. 23 is a circuit diagram showing another arrangement in which the transition state detecting device of the present invention is applied to a spectrum analyzer;

FIG. 24 is a graph showing a signal waveform appearing at a display section of the spectrum analyzer in FIG. 21;

FIG. 25 is a graph showing signal waveforms appearing at a display section of the oscilloscope in FIG. 22;

FIG. 26 is a graph showing other signal waveforms appearing at the display section of the spectrum analyzer in FIG. 23;

FIGS. 27(A) are 27(B) are graphs showing a state wherein levels of a detection signal are determined in accordance with two frequencies $f_{IF1}$ and $f_{IF2}$;

FIG. 28 is a circuit diagram for explaining an outline of the transition state detecting device of the present invention; and (A) to (E) of FIG. 29 are timing charts showing signal waveforms appearing at the respective portions of the circuit in FIG. 28.

BEST MODE OF CARRYING OUT THE INVENTION

An outline of a transition state detecting device (to be referred to as a detecting device hereinafter) of the present invention will be described below with reference to FIGS. 28 and 29.

The detecting device of the present invention is a device for receiving a transient response output, as an input signal a, from a device as an object to be measured, and outputting a change in transition waveform at its leading edge as one parameter (e.g., a voltage value). More specifically, the transition waveform is differentiated by a differentiator 150 to obtain its inclination c. This inclination is then raised to the nth (n is an integer) power using an nth-power calculator 151 so as to amplify a change in inclination. In addition, a signal d obtained by this amplification is integrated by an integrator 152, and a result e of this integration is held/output by a data hold unit 154 while the result e is updated every time a transition occurs. This output becomes a parameter varying in proportion to the inclination of the input signal a. This parameter allows realtime, quantitative determination of a change in transition state of the input signal as a function of time and the quality of the object to be measured (input signal). Note that control of integration and data hold is performed by a trigger signal b which is generated by a trigger generator 153 when the transition waveform exceeds a threshold value.

The present invention comprises a detecting device and a measuring device using the same. The detecting device will be described first. FIG. 1 shows the detecting device according to the first embodiment of the present invention.

Referring to FIG. 1, an electrical signal (to be referred to as an input signal hereinafter) a(t) to be input to an input terminal 7 is a digital signal which alternately transits between multi-value voltage levels, e.g., binary voltage levels as a function of time. The input signal a(t) is differentiated by a differentiating circuit 1. As a result, a differential signal b(t) represented by the following equation is output:

$$b(t) = \frac{da(t)}{dt}$$

The differential signal b(t) is input to a peak detecting circuit 2. The circuit 2 detects a peak value P(t) of the differential signal b(t) and outputs it. This differential signal b(t) represents, e.g., the inclination of a leading or trailing edge of a waveform, i.e., speed, when the input signal a(t) transits between the binary voltage levels. The peak value P(t) represents the maximum speed. Therefore, the peak value P(t) allows evaluation of the characteristics of the waveform of a digital signal such as a PCM signal at its leading or trailing edge.

FIG. 2 shows an arrangement in which the respective components of the device shown in FIG. 1 are constituted by analog circuits using operational amplifiers.

FIG. 3 shows signal waveforms at the respective portions in FIG. 2.

Referring to FIG. 2, the differentiating circuit 1 comprises an operational amplifier A11, resistors R11 and R12, and a capacitor C11. With this arrangement, the input signal a(t) is differentiated, and the differential signal b(t) is output. Since the polarity of the differential signal at this time is reversed, a signal −b(t) is actually output as the differential signal from the differentiating circuit 1.

As is apparent from FIG. 2, the peak detecting circuit 2 comprises an operational amplifier A21, resistors R21 and R22, a capacitor C21, and a diode D22. As shown in FIG. 3, the peak detecting circuit 2 stores only the peak value of a portion of the inverted differential signal −b(t) corresponding to a leading edge portion of the input signal a(t), and outputs it as a peak value $P_+(t)$. As a result, a change in transition state of the input signal is output as a parameter (voltage value).

FIG. 4 shows another circuit arrangement of the peak detecting circuit 2 in FIG. 1. FIG. 5 shows signal waveforms at the respective portions of the circuit.

In this case, the peak detecting circuit 2 comprises an operational amplifier A21, a capacitor C21, and a diode D21. With this circuit arrangement, the circuit 2 stores only the peak value of a portion of the inverted differential signal −b(t) corresponding to a trailing edge portion of the input signal a(t), and outputs it as a peak value $p_-(t)$.

FIG. 6 shows still another circuit arrangement of the peak detecting circuit 2 in FIG. 1. FIG. 7 shows signal waveforms at the respective portions in the circuit.

In this case, the peak detecting circuit 2 comprises an operational amplifier A21, resistors R21 and R22, capacitors C21 and C22, and diodes D21 and D22. With this circuit arrangement, the circuit 2 detects the maximum amplitude of the inverted differential signal −b(t), and outputs it as a peak value $P_{p-p}(t)$.

FIG. 8 shows still another circuit arrangement of the peak detecting circuit 2 in FIG. 1. FIG. 9 shows signal waveforms at the respective portions of the circuit. In this case, the peak detecting circuit 2 comprises an absolute value calculating circuit 3 constituted by operational amplifiers A31 and A32, resistors R31, R32, R33, R34, and R35, and diodes D31 and D32. The absolute value of the inverted differential signal −b(t) is obtained by the circuit 3, and an absolute value waveform |b(t)| is output from the circuit 2. The peak value of the absolute value waveform |b(t)| is detected by a circuit constituted by an operational amplifier A21, a capacitor C21, and a diode D21 and is output as a peak value $P_{+/-}(t)$ from the circuit 2.

In the above-described embodiment, each of the peak values $P_+(t)$, $P_-(t)$, $P_{p-p}(t)$, and $P_{+/-}(t)$ represents the peak value of a differential waveform corresponding to either or both of leading and trailing edge portions of the input signal a(t).

Each detecting device of the above-described embodiment comprises analog circuits. However, as shown in FIG. 10, the detecting device of the present invention may comprise an A/C converter 4, a digital differentiating circuit 5 using a digital arithmetic circuit, and a digital peak detecting circuit 6. In addition, the digital differentiating circuit 5 and the digital peak detecting circuit 6 may be constituted by a microcomputer.

FIG. 11 shows a circuit arrangement, using a detecting device 107 of the present invention, for evaluating the characteristics of signals output from a plurality of low-pass filters (to be referred to as LPFs hereinafter).

A signal generator (GEN) 105 outputs, as an input signal a(t) to each LPF, a pulse signal transiting between binary voltage levels. Note that the rise time of this pulse signal is 1 μsec or less. The pulse signal output from the signal generator 105 is input to eight types of LPFs 111 to 118 respectively having cutoff frequencies of 100 Hz, 200 Hz, 500 Hz, 1 kHz, 2 kHz, 5 kHz, 10 kHz, and 20 kHz. One of outputs from the LPFs 111 to 118 is selected by a switch (SW) 106 and is supplied to the detecting device 107 of the present invention. The detecting device 107 differentiates the output and detects the peak value of an obtained differential waveform, thus quantitatively evaluating the characteristics of the LPF. The evaluation result is then displayed by a display section 108. FIG. 12 shows a result obtained by evaluating the rising characteristics of an output signal from each LPF. That is, FIG. 12 shows a relationship between the cutoff frequency of each LPF and a peak value y of a differential waveform. As a result, the manner in which the rising characteristics of a signal changes in accordance with an LPF to be used can be detected.

As described above in detail, the present invention comprises a differentiating circuit for differentiating an input signal transiting between a plurality of voltage levels as a function of time, and outputting the resultant value as a differential signal, and a peak detecting circuit for detecting the peak value of the differential signal upon every transition of the input signal. With this arrangement, as is apparent from the case wherein the low-pass filters are used, the characteristics of a transition of an input signal between levels, e.g., the rising or falling characteristics, can be quantitatively evaluated.

In addition, since the above operation is performed without a circuit for storing an input signal, a parameter (peak value of speed) allowing real-time, direct evaluation can be obtained. Therefore, an automatic evaluation system can be realized at low cost.

FIG. 13 shows a detecting device according to the second embodiment of the present invention.

Referring to FIG. 13, an arithmetic section 100 comprises: an A/D converter 11 for quantizing an input signal X(t) supplied to an input terminal 9 so as to obtain a digital signal; a differentiator 12 for differentiating the obtained digital signal so as to output a differential signal; a squaring circuit 13 for squaring the differential signal; and an integrator 14 for integrating an output from the squaring circuit 13. A detecting section 200 comprises a detector 15 for detecting transition start time when the input signal X(t) starts transiting between multi-value voltage levels, and supplying a trigger signal representing the start of integration to the integrator 14.

An operation of the circuit having the abovedescribed arrangement will be described below with reference to FIGS. 13 and 16. (A) to (H) of FIG. 16 show signal waveforms appearing at the respective portions of the circuit in FIG. 13. Although a digital signal actually appears at each portion, each signal is shown as an analog value in the drawings.

An input signal X(t) transiting between, e.g., binary levels as a function of time ((A) of FIG. 16) is converted by the A/D converter 11 into a digital signal Xi in each sampling interval Δt. In this case, reference symbol i denotes a suffix representing a sampling point at which the input signal X(t) is sampled and quantized to be converted into a digital signal $X_i$. The suffix i is given as i=0, 1, 2, ..., n. This digital signal $X_i$ is differentiated by the differentiator 12 in the sampling interval Δt, and is converted into a signal $\Delta X_i = X_i - X_{i-1}$ or $(X_i - X_{i-1})/\Delta t$, i.e., $dX(t)/dt$ when expressed for unit time. The differential signal is then supplied to the squaring circuit 13. The squaring circuit 13 squares the input signal $\Delta X_i$, and supplies the obtained square signal $\Delta X_i^2$, i.e., $(dX(t)/dt)^2$ to the integrator 14. (C) and (D) of FIG. 16 respectively show the waveforms of these signals $\Delta X_i$ and $\Delta X_i^2$.

Meanwhile, the detecting section 200 detects a transition of the signal level of the input signal X(t) by comparing the signal level of the input signal X(t) at the corresponding time with a predetermined threshold level. At the same time, transition start time $t_0$ of the above level is detected. The detection result including the time $t_0$ is supplied as a trigger signal g(t) ((B) of FIG. 16) to the integrator 14. The integrator 14 integrates the square signal $\Delta X_i^2$ from the squaring circuit 13 during an interval between the time $t_0$ at which the trigger signal g(t) is received and time $t_0 + T$ at which the level transition of the input signal X(t) is ended, i.e., during a time T ($T = n + \Delta t$) (n is an integer). As a result, $$y = \Delta T \int_{t_0}^{t_0 + T} (dX(t)/dt)^2 dt \text{ is obtained from}$$

$$y = \sum_{i=i_0}^{i_0+n-1} \Delta X_i^2$$

The obtained value of y is output as a parameter (voltage value) after $t_0 + T$ (see (F) and (H) of FIG. 16).

In this case, $i_0$ is the value of i at time $t_0$ at which the integrator 14 receives the trigger signal g(t) from the detector 15, and also represents the time when ΔT occurs. Reference symbol T corresponds to $\Delta T_{i0}+\Delta T_{i0+1}+,\ldots +\Delta T_{i0+n-1}$.

In addition, $\Delta X_i$ or $dX(t)/dt$ represents the speed of the input signal X(t) at a leading or trailing edge, and y is an energy amount in a transition time band T. According to the present invention, therefore, the waveform characteristics of a digital signal such as a PCM signal at its leading and trailing edge can be quantitatively evaluated as an energy amount, i.e., the magnitude of y.

Each component of the embodiment in FIG. 13 will be described in detail below.

FIG. 14 shows a circuit arrangement of the differentiator 12 in FIG. 13. A digital input signal $X_i$ is delayed by a register 12a by one sampling clock ($\Delta T$) and is output as a signal $X_{i-1}$. The signal $X_{i-1}$ is subtracted from the digital signal $X_i$, and $\Delta X_i = X_i - X_{i-1}$ is calculated.

The squaring circuit 13 will be described next. The squaring circuit 13 can be realized by using, e.g., a read-only memory (to be referred to as a ROM herein-after). More specifically, the binary value of an input signal $\Delta X_i$ is input as an address value to the address terminal of the ROM. The square of each value of the input signal $\Delta X_i$ is stored at a storage area corresponding to each address of the ROM. With this arrangement, a square value $\Delta X_i^2$ corresponding to the input signal (address) $\Delta X_i$ is output from the ROM, i.e., the squaring circuit 13. FIG. 15 shows a detailed arrangement of the integrator 14 in FIG. 13. When a trigger signal g(t) (see (B) of FIG. 16) representing the transition start of an input signal X(t) is supplied from the detector 15 to the integrator 14, a timer 14d is started. The timer 14d supplies a signal a(t) as a command enabling integration to a register 14b, and at the same time supplies a signal b(t) as a command for storing an integration result to a register 14c (see (E), (F), and (G) of FIG. 16). Every time an adder 14a receives an integrated signal $\Delta X_i^2$, it adds the signal $\Delta X_i^2$ to an output from the register 14b. An integral value as the addition result is stored in the register 14b. The register 14c can store the integral value only while it receives the signal a(t) enabling integration from the timer 14d. The value of the register 14c is cleared to be zero during other periods of time. The register 14c receives the signal b(t) after a time T from the beginning of integration, and stores an integral result output from the register 14c.

Other embodiments of the circuit in FIG. 13 will be described below.

FIG. 17 shows a case wherein a wave memory 16 is connected to the output of the A/D converter 11 in FIG. 13, and the arithmetic functions of the differentiator 12, the squaring circuit 13, and the integrator 14 are replaced with a microcomputer 17. In this case, the wave memory 16 stores waveform data during a time T in response to a trigger signal g(t) from a detector 15. Thereafter, the microcomputer 17 calculates $$y = \sum_{i=i_o}^{i_o+n-1} (X_{i+1} - X_i)^2,$$

and outputs a signal y as a calculated result.

FIG. 18(A) shows a case wherein the differentiator 12 in FIG. 13 is realized by an analog circuit. In this case, an input signal X(t) is directly input to the differentiator 12 to be differentiated, and is output as an analog waveform represented by:

$$X'(t) = \frac{dX(t)}{dt}$$

An A/D converter 11 quantizes the output X'(t) from the differentiator 12 and outputs a signal $\Delta X_i$.

FIG. 18(B) shows a case wherein the squaring circuit 13 in FIG. 18(A) is realized by an analog circuit. As the squaring circuit 13, an analog multiplier (not shown) for multiplying, e.g., a plurality of signals is used. When a signal X'(t) is input to the two input terminals of the analog multiplier, the multiplier outputs a signal $(X'(t))^2$. An A/D converter 11 quantizes the signal $(X'(t))^2$ and outputs a signal $\Delta X_i^2$.

FIG. 18(C) shows a case wherein all the circuits in FIG. 13 are realized by analog circuits. In this case, if a predetermined time constant is provided to an integrator 14 to set an integration time T, the detecting section 200 in FIG. 13 can be omitted. However, a hold circuit 18 for holding an integration result is required instead.

In the embodiments in FIGS. 18(A) and 18(B), the detecting section 200 in FIG. 13 is used in the same manner. However, this detecting section 200 can detect the start time of a level transition of the input signal X(t) from the signal level of an analog signal before it is input to the A/D converter 11, i.e., the signal X'(t), $(X'(t))^2$, or the like. In addition, if a digital comparator is used, the detecting section 200 can detect the start time of a level transition of the input signal X(t) from the signal level of one of the digital signals $X_i$, $\Delta X_i$, and $\Delta X_i^2$ prior to input to the integrator 14 in FIG. 13. In this embodiment, a squaring circuit is used. However, as described in the outline, the present invention is not limited to this, and an nth-power calculator may be used.

As shown in FIG. 19, if a delay unit 19 is arranged between the A/C converter 11 and the integrator 14 in FIG. 13, a delay of the start time of integration corresponding to the start time of a level transition of an input signal X(t) can be corrected. This delay unit 19 can be constituted by a shift register or the like. Similar delay units may be separately inserted between the respective arithmetic circuits.

FIG. 20 shows a result obtained by evaluating the characteristics of signals output from a plurality of LPFs by using the detecting device 107 of the second embodiment. Although the circuit arrangement used in this evaluation operation is the same as that shown in FIG. 11, LPFs to be evaluated respectively have nine different off-cut frequencies as follows: 100 kHz, 50 kHz, 20 kHz, 10 kHz, 5 kHz, 2 kHz, 1 kHz, 500 Hz, and 200 Hz.

As is apparent from FIG. 20, a result similar to that obtained by using the circuit arrangement in FIG. 11 is obtained, and hence the manner in which the rising characteristics of a signal change in accordance with an LPF to be used can be detected.

As has been described above, the present invention comprises: a detecting section for receiving an input signal whose level transits between multi-value voltage levels as a function of time, and detecting the start time of the level transition; and an arithmetic section for differentiating and squaring an input signal, and integrating the resultant value during an interval between the start time and at least the end time of the level transition. With this arrangement, as is apparent from the evaluation results, the characteristics and the like of a transition of an input signal between different levels, e.g., rising and falling characteristics can be quantitatively evaluated.

Since a parameter (energy amount during transition) allowing real-time, direct evaluation of an input signal can be obtained, an automatic evaluation system can be realized at low cost.

A measuring device using the detecting device of the present invention will be described below with reference to FIGS. 21 to 23.

FIG. 21 shows a circuit designed to evaluate the rising characteristics of a VCO 120 by using a spectrum analyzer. As shown in FIG. 21, the VCO 120 receives an input signal, e.g., a pulse signal, transiting between binary voltage levels "1" and "0", and outputs a signal corresponding to its characteristics. More specifically, the VCO 120 outputs a signal having frequencies f1 and f2 respectively corresponding to levels "0" and "1". This signal is mixed with an output from a local oscillator (LO) 125 having a fixed frequency, i.e., a zero span mode by a mixer 121 so as to be frequency-converted. That is, a signal having two intermediate frequencies $f_{IF1}$ and $f_{IF2}$ is output from the mixer 121. Only a predetermined frequency component is extracted from this output by a bandpass filter (BPF) 122 and is supplied to a detector 123. The signal extracted by the detector 123 is frequency-discriminated, and the levels of a detection signal corresponding to the two frequencies $f_{IF1}$ and $f_{IF2}$ are determined, as shown in FIGS. 27(A) and 27(B). The detection output is supplied to a detecting device 107 of the present invention, and its transition state is detected. The detection result is displayed by a display section 124, as shown in FIG. 24. With this operation, real-time, quantitative evaluation of the rising characteristics of the VCO 120 as a device to be tested can be performed on the basis of the signal levels of the displayed waveform.

The sweep timing of the local oscillator 125, the detection timing of the detecting device 107 of the present invention, and the display timing of the display section 124 are respectively controlled by control signals from a control section 126.

If the characteristics of the VCO 120 vary or change over time, the amplitude of the waveform shown in FIG. 24 changes accordingly. Therefore, by detecting this change, the variations and changes in characteristics over time can be measured.

In addition, the detector 123 can be replaced with an FM detector. Since variations in frequency can be converted into variations in amplitude by the FM detector, the levels of a detection signal can be determined.

FIG. 22 shows a circuit arrangement for testing a VCO 120 by using an oscilloscope. An arrangement of this circuit before a detector 123 is the same as that of the equivalent portion of the spectrum analyzer in FIG. 21. However, in the oscilloscope, outputs from a detecting device 107 of the present invention and the detector 123 are simultaneously displayed, as shown in FIG. 25. Referring to FIG. 25, a waveform A represents the output from the detecting device 107 of the present invention; and a waveform B, the output from the detector 123.

FIG. 23 shows a circuit arrangement for determining the deviation of an input signal by using a spectrum analyzer. An input signal generated by a signal generator 127 is mixed with an output from a local oscillator (LO) 125 having a sweep mode by a mixer 121 so as to be frequency-converted. The frequency-converted signal is supplied to a detector 123 through a bandpass filter (BPF) 122 and is detected. The detection output is supplied to a display section 124. At the same time, the detection output is supplied to a detecting device 107 of the present invention, and its transition state is detected. That is, the leading edges of a continuous wave (CW) and a modulated signal are detected, and their difference is quantitatively output. As a result, the continuous wave and the modulated signal are discriminated from each other on the basis of the difference between the detection results, and hence the presence/absence of a deviation can be determined. As shown in FIG. 26, the display section 124 simultaneously displays a detected signal B and a determination result A. Therefore, comparison between these signals can be easily performed. In addition, the determination result can be displayed with a lamp.

The sweep timing of the local oscillator 125, the detection timing of the detecting device 107 of the present invention, and the display timing of the display section 124 are respectively controlled by control signals from a control section 126.

INDUSTRIAL APPLICABILITY

As is apparent from the above description, if the transition state detecting device of the present invention is incorporated in an electronic measuring device such as an oscilloscope or spectrum analyzer, real-time, quantitative measurement of the rising characteristics of a device to be tested such as a VCO can be performed.

We claim:

1. A transition state detecting device comprising:
    receiving means for receiving an input signal transiting across a predetermined threshold value;
    differentiating means for differentiating the input signal received by said receiving means and for outputting a differential signal representing a transition state of the input signal;
    detecting means for detecting that the input signal received by said receiving means reaches the threshold value;
    integrating means for integrating the differential signal output from said differentiating means within a predetermined period of time after the input signal which transits across the threshold value is detected by said detecting means, and for outputting a parameter corresponding to the transition state of the input signal; and
    nth-power calculating means for raising the differential signal to the nth power and for outputting an nth-power signal.

2. A device according to claim 1, wherein said nth-power calculating means includes squaring circuit means for squaring the differential signal and outputting a square signal.

3. A device according to claim 1, further comprising A/D-converting means for converting the input signal into a digital signal.

4. A device according to claim 1, wherein said detecting means includes means for comparing a level of the input signal with a level of a reference signal and for supplying a predetermined signal to said integrating means.

5. A device according to claim 1, wherein said differentiating means includes a differentiating circuit comprising:
    a register for storing the input signal; and
    a subtracter for subtracting the input signal stored in said register from the input signal.

6. A device according to claim 2, wherein said integrating means includes an integrator comprising:
a first register for storing the square signal;
an adder for adding the square signal to the square signal stored in said first register;
a second register for storing an addition result obtained by said adder; and
a timer for receiving an output from said detecting means and respectively supplying predetermined signals to said first and second registers.

7. A device according to claim 2, wherein said differentiating means, said squaring circuit means, and said integrating means are comprised of a microcomputer.

8. A device according to claim 7, wherein said microcomputer includes a wave memory.

9. A device according to claim 1, further comprising a delay unit for delaying the differential signal.

10. A measuring device comprising:
receiving means for receiving an output signal output from an object to be measured, the output signal transiting across a predetermined threshold value;
converting means for frequency-converting the output signal received by said receiving means and for outputting a conversion signal;
first detecting means for frequency-discriminating the conversion signal output from said converting means and for outputting a first detection signal;
differentiating means for differentiating the first detection signal output from said first detecting means and for outputting a differential signal representing a transition state of the output signal;
second detecting means for detecting that the output signal output from said receiving means reaches the threshold value;
integrating means for integrating the differential signal output from said differentiating means within a predetermined period of time after the output signal which transits across the threshold value is detected by said second detecting means, and for outputting a parameter corresponding to the transition state of the output signal;
display means for displaying the parameter output from said integrating means; and
nth-power calculating means for raising the differential signal to the nth power.

11. A device according to claim 10, further comprising determining means for determining the parameter.

12. A device according to claim 10, wherein said nth-power calculating means includes a squaring circuit.

* * * * *

UNITED STATES PATENT AND TRADEMARK OFFICE
CERTIFICATE OF CORRECTION

PATENT NO. : 5,083,282
DATED : January 21, 1992
INVENTOR(S) : KATAYAMA et al

It is certified that error appears in the above-identified patent and that said Letters Patent is hereby corrected as shown below:

TITLE PAGE:

Section [56] References Cited, under "U.S. Patent Documents", insert the following:

3,869,666  3/1975   Saltz et al......324/76R
4,127,780  11/1978  Kimbell..........250/559

Signed and Sealed this

Twentieth Day of July, 1993

Attest:

MICHAEL K. KIRK

Attesting Officer

Acting Commissioner of Patents and Trademarks